United States Patent
Tsai et al.

(10) Patent No.: US 8,952,502 B2
(45) Date of Patent: Feb. 10, 2015

(54) SEMICONDUCTOR PATTERNING

(71) Applicant: Taiwan Semiconductor Manufacturing Company Limited, Hsin-Chu (TW)

(72) Inventors: Cheng-Hsiung Tsai, Miaoli County (TW); Chung-Ju Lee, Hsinchu (TW); Yu-Sheng Chang, Taipei (TW); Tsung-Jung Tsai, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/010,991

(22) Filed: Aug. 27, 2013

(65) Prior Publication Data

US 2014/0138801 A1    May 22, 2014

Related U.S. Application Data

(63) Continuation of application No. 13/680,575, filed on Nov. 19, 2012, now Pat. No. 8,518,836.

(51) Int. Cl.
| | |
|---|---|
| *H01L 23/58* | (2006.01) |
| *H01L 21/308* | (2006.01) |
| *H01L 21/033* | (2006.01) |
| *H01L 21/311* | (2006.01) |
| *B81C 1/00* | (2006.01) |
| *H01L 29/02* | (2006.01) |

(52) U.S. Cl.
CPC .......... *H01L 21/308* (2013.01); *H01L 21/0337* (2013.01); *H01L 21/31144* (2013.01); *B81C 1/00031* (2013.01); *H01L 29/02* (2013.01); *B81C 2201/0149* (2013.01)
USPC .................... 257/642; 257/623; 257/E21.242

(58) Field of Classification Search
USPC .................... 257/E21.246, E21.487, E21.492
See application file for complete search history.

(56) References Cited

U.S. PATENT DOCUMENTS

| | | | | |
|---|---|---|---|---|
| 2008/0299774 | A1* | 12/2008 | Sandhu | 438/696 |
| 2009/0317644 | A1* | 12/2009 | Heller et al. | 428/461 |
| 2013/0048605 | A1* | 2/2013 | Sapre et al. | 216/51 |

* cited by examiner

*Primary Examiner* — Cheung Lee
(74) *Attorney, Agent, or Firm* — Cooper Legal Group, LLC

(57) ABSTRACT

One or more techniques or systems for forming a pattern during semiconductor fabrication are provided herein. In some embodiments, a photo resist (PR) region is patterned and a spacer region is formed above or surrounding at least a portion of the patterned PR region. Additionally, at least some of the spacer region and the patterned PR region are removed to form one or more spacers. Additionally, a block co-polymer (BCP) is filled between the spacers. In some embodiments, the BCP comprises a first polymer and a second polymer. In some embodiments, the second polymer is removed, thus forming a pattern comprising the first polymer and the spacers. In this manner, a method for forming a pattern during semiconductor fabrication is provided, such that a width of the spacer or the first polymer is controlled.

20 Claims, 12 Drawing Sheets

SEMICONDUCTOR PATTERNING

RELATED APPLICATION

This application is a continuation of U.S. Non-Provisional patent application Ser. No. 13/680,575, filed on Nov. 19, 2012 and entitled "SEMICONDUCTOR PATTERNING," which is incorporated herein.

BACKGROUND

Generally, patterning during semiconductor fabrication is associated with limitations, such as pattern density limitations, etc. For example, patterns associated with a dimension or feature size less than a critical dimension are generally of poor quality.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming a pattern during semiconductor fabrication are provided herein. In some embodiments, a photo resist (PR) region is formed and patterned. In some embodiments, a spacer region is formed above or surrounding at least a portion of the patterned PR region. In some embodiments, at least some of the spacer region is removed to form one or more spacers. Additionally, the patterned PR region is removed such that a spacer pattern is formed comprising the one or more spacers and one or more sub-gaps. For example, the spacer pattern is associated with a first spacer, a first sub-gap, a second spacer, a second sub-gap, etc. According to some aspects, at least some of the sub-gaps are filled with a block co-polymer (BCP). In some embodiments, the BCP comprises a first polymer and a second polymer. Additionally, in some embodiments, the BCP is self aligning. For example, the BCP self aligns such that the second polymer is in contact with the one or more spacers and the first polymer is not in contact with any spacers. In some embodiments, the second polymer is removed, thus forming a pattern comprising the first polymer and the spacers. For example, the pattern comprises elements, such as a first spacer, a first 'second polymer' location, a first 'first polymer' spacer, a second 'second polymer' location, a second spacer, etc. It will be appreciated that a width of an element associated with the pattern is thus controlled accordingly. For example, the width of an element, such as the first 'first polymer' spacer, is controlled based on the BCP. In some embodiments, the width of an element, such as the first spacer, is controlled based on formation of the spacer region.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
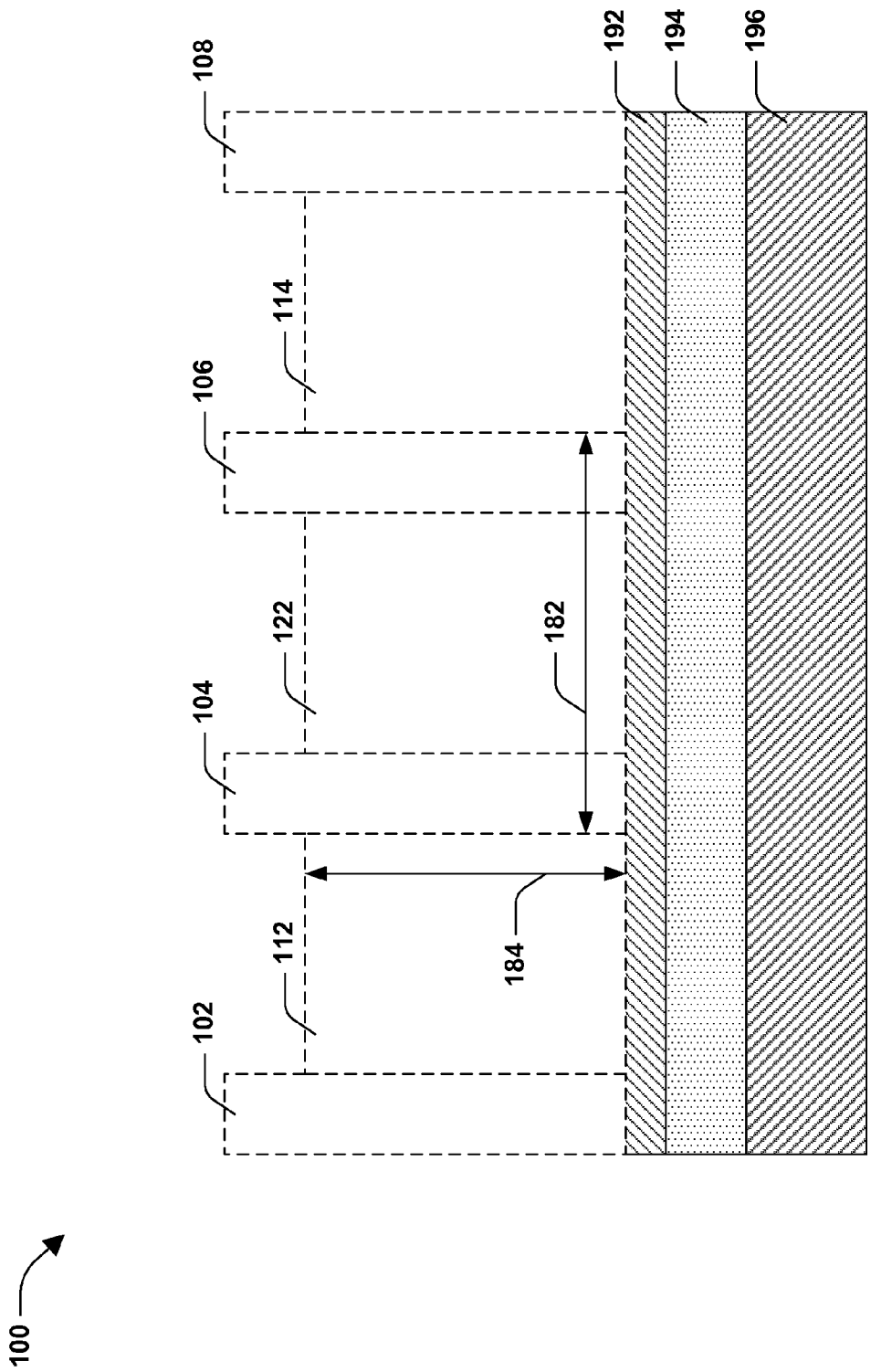
FIG. 1 is a cross-sectional view associated with formation of an example pattern during semiconductor fabrication, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer' or 'location', as used herein, contemplates a region or a position, and does not necessarily comprise a uniform thickness or uniform boundaries. For example, a layer is a region, such as an area comprising arbitrary boundaries. For another example, a layer is a region comprising at least some variation in thickness.

The following figures illustrate formation of an example pattern during semiconductor fabrication, according to some embodiments. It will be appreciated that the respective figures are described with reference to one another, such as with reference to a previous figure, for example. Accordingly, FIG. 1 is a cross-sectional view 100 associated with formation of an example pattern during semiconductor fabrication, according to some embodiments. In some embodiments, a dielectric region 196 is formed. In some embodiments, a hard mask (HM) region 194 is formed above at least some of the dielectric region 196. In some embodiments, a neutralized region 192 is formed above at least some of the HM region 194. In some embodiments, one or more locations are associated with formation of the pattern. For example, a first spacer location 102, a second spacer location 104, a third spacer location 106, and a fourth spacer location 108 are associated with formation of the pattern. Additionally, a first photo resist (PR) location 112 and a second PR location 114 are associated with formation of the pattern. In some embodiments, a first gap 182 is between the first PR location 112 and the second PR location 114. In some embodiments, the first gap 182 is associated with the second spacer location 104, a first sub-gap 122, and the third spacer location 106. In some embodiments, at least one of the first spacer location 102, second spacer location 104, third spacer location 106, fourth spacer location 108, first PR location 112, or second PR location 114 is above the neutralized region 192, for example. In some embodiments, the first PR location 112 is between the first spacer location 102 and the second spacer location 104. In some embodiments, the second spacer location 104 is between the first PR location 112 and the first sub-gap 122. In some embodiments, the first sub-gap 122 is between the second spacer location 104 and the third spacer location 106. In some embodiments, the third spacer location 106 is between the first sub-gap 122 and the second PR location 114. In some embodiments, the second PR location 114 is between the third spacer location 106 and the fourth spacer location 108. In some embodiments, the first PR location 112 is associated with a height 184. In some embodiments, the second PR location 114 is associated with the same height 184.

Figure 2:
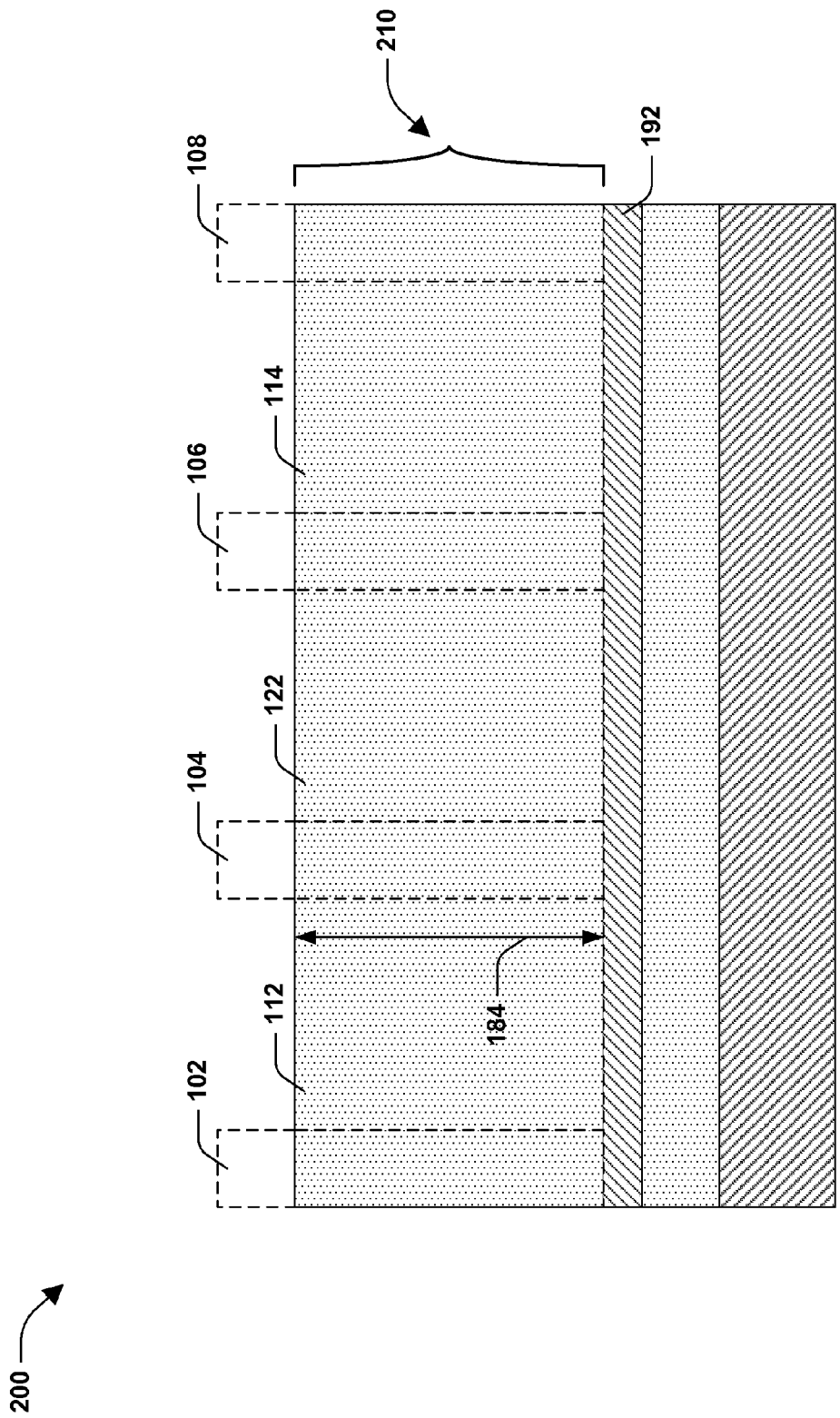
FIG. 2 is a cross-sectional view associated with formation of an example pattern during semiconductor fabrication, according to some embodiments.

FIG. 2 is a cross-sectional view 200 associated with formation of an example pattern during semiconductor fabrication, according to some embodiments. For example, a photo resist (PR) region 210 is formed above at least some of the neutralized region 192. It will be appreciated that the PR region 210 is associated with the same height 184 as the first PR location 112 of FIG. 1, for example. It will be appreciated that at least a portion of at least one of the first spacer location 102, the second spacer location 104, the third spacer location 106, or the fourth spacer location 108 is above at least one of the height 184 of the PR region 210, the PR region 210, the first PR location 112, the second PR location 114, or the first sub-gap 122.

Figure 3:
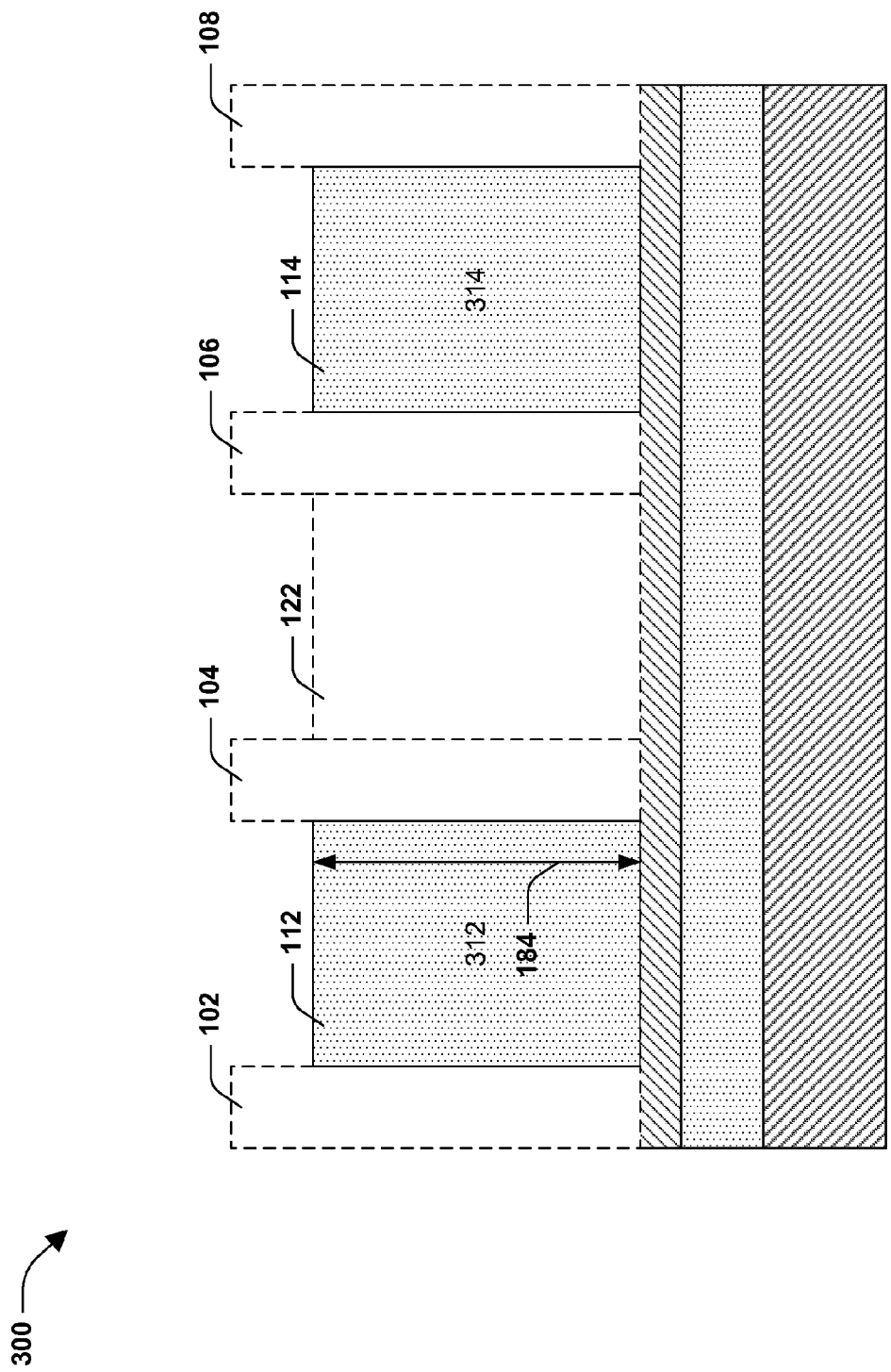
FIG. 3 is a cross-sectional view associated with formation of an example pattern during semiconductor fabrication, according to some embodiments.

FIG. 3 is a cross-sectional view 300 associated with formation of an example pattern during semiconductor fabrication, according to some embodiments. In some embodiments, the PR region 210 of FIG. 2 is patterned to form a patterned PR region comprising one or more PR regions. For example, the patterned PR region comprises a first PR region 312 and a second PR region 314. In some embodiments, the first PR region 312 is formed at the first PR location 112. In some embodiments, the second PR region 314 is formed at the second PR location 114. It will be appreciated that at least one of the first PR region 312 or the second PR region 314 is associated with height 184. In some embodiments, PR associated with at least one of the first spacer location 102, the second spacer location 104, the third spacer location 106, the fourth spacer location 108, or the first sub-gap 122 is removed. For example, the PR region 210 of FIG. 2 is patterned based on a mask to form the patterned PR region. It will be appreciated that the first PR region 312 and the second PR region 314 are separated by the second spacer location 104, the first sub-gap 122, and the third spacer location 106. In some embodiments, the first gap 182 of FIG. 1 is between the first PR region 312 and the second PR region 314. In some embodiments, the patterned PR region comprises at least one of the first PR region 312 or the second PR region 314. In some embodiments, the PR of the PR region 210 comprises a positive tone PR. Additionally, the PR is associated with a high resolution PR, thus enabling the PR to be exposed as a PR column with a narrow width, for example. In some embodiments, the high resolution PR enables at least one of the first PR region 312 or the second PR region 314 to comprise a width less than forty eight nanometers, for example.

Figure 4:
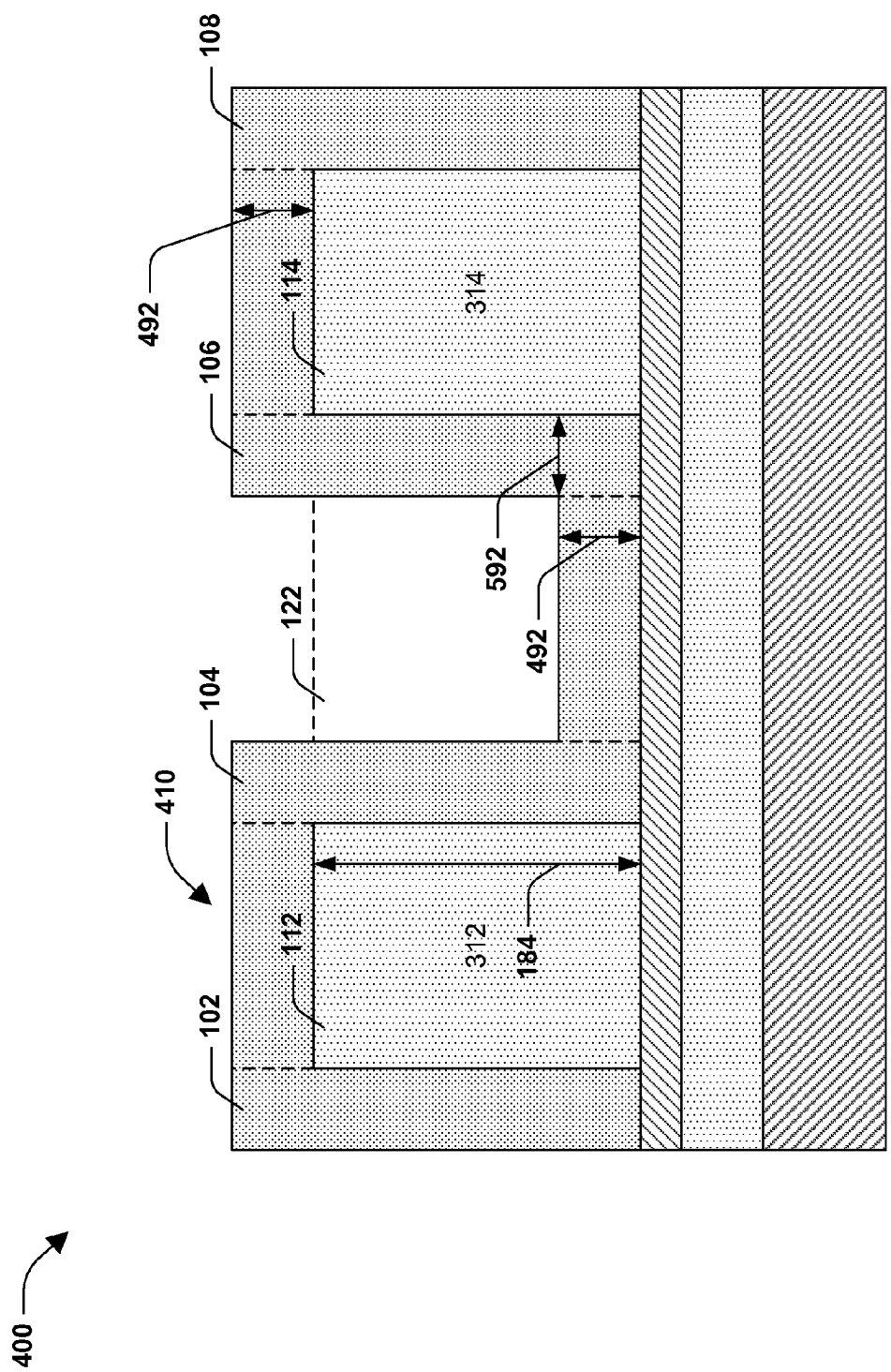
FIG. 4 is a cross-sectional view associated with formation of an example pattern during semiconductor fabrication, according to some embodiments.

FIG. 4 is a cross-sectional view 400 associated with formation of an example pattern during semiconductor fabrication, according to some embodiments. In some embodiments, a spacer region 410 is formed, such as above the structure of FIG. 3. In some embodiments, the spacer region 410 is associated with a spacer region thickness 492. It will be appreciated that the spacer region thickness 492 of the spacer region 410 is adjusted according to a desired thickness in some embodiments. In some embodiments, the spacer region 410 is formed to surround at least a portion of the patterned PR region. In some embodiments, the spacer region 410 is formed at least one of to a side of a PR region or above the PR region. For example, the spacer region 410 is formed within the first spacer location 102 and the second spacer location 104. Additionally, the spacer region 410 is formed above the first PR region 312. Similarly, the spacer region 410 is formed within the third spacer location 106, the fourth spacer location 108, and above the second PR region 314. In some embodiments, the spacer region 410 is formed within at least some of the first sub-gap 122. For example, the spacer region 410 within the first sub-gap 122 is formed to comprise the spacer region thickness 492. In some embodiments, a width of at least one of the first spacer location 102, the second spacer location 104, the third spacer location 106, or the fourth spacer location 108 is the same as the spacer region thickness 492. For example, a width 592 of the spacer region 410 associated with the third spacer location 106 is the same as the spacer region thickness 492 of the spacer region 410. In some embodiments, the thickness of the spacer region 410 above at least one of the first PR region 312 or the second PR region 314 is the same as the spacer region thickness 492. In some embodiments, the spacer region 410 comprises at least one of spacer oxide, spacer nitride, or a metal spacer. For example, a metal spacer is titanium nitride (TiN), or any metal suitable for spacers. In some embodiments, the spacer region 410 is formed by deposition, for example. It will be appreciated that in some embodiments, the spacer region 410 is formed at low temperatures, such as below one hundred degrees Celsius, for example. It will be appreciated that a resolution associated with a pattern is associated with the spacer region thickness 492 of the spacer region 410, as will be described in more detail in FIG. 7.

Figure 5:
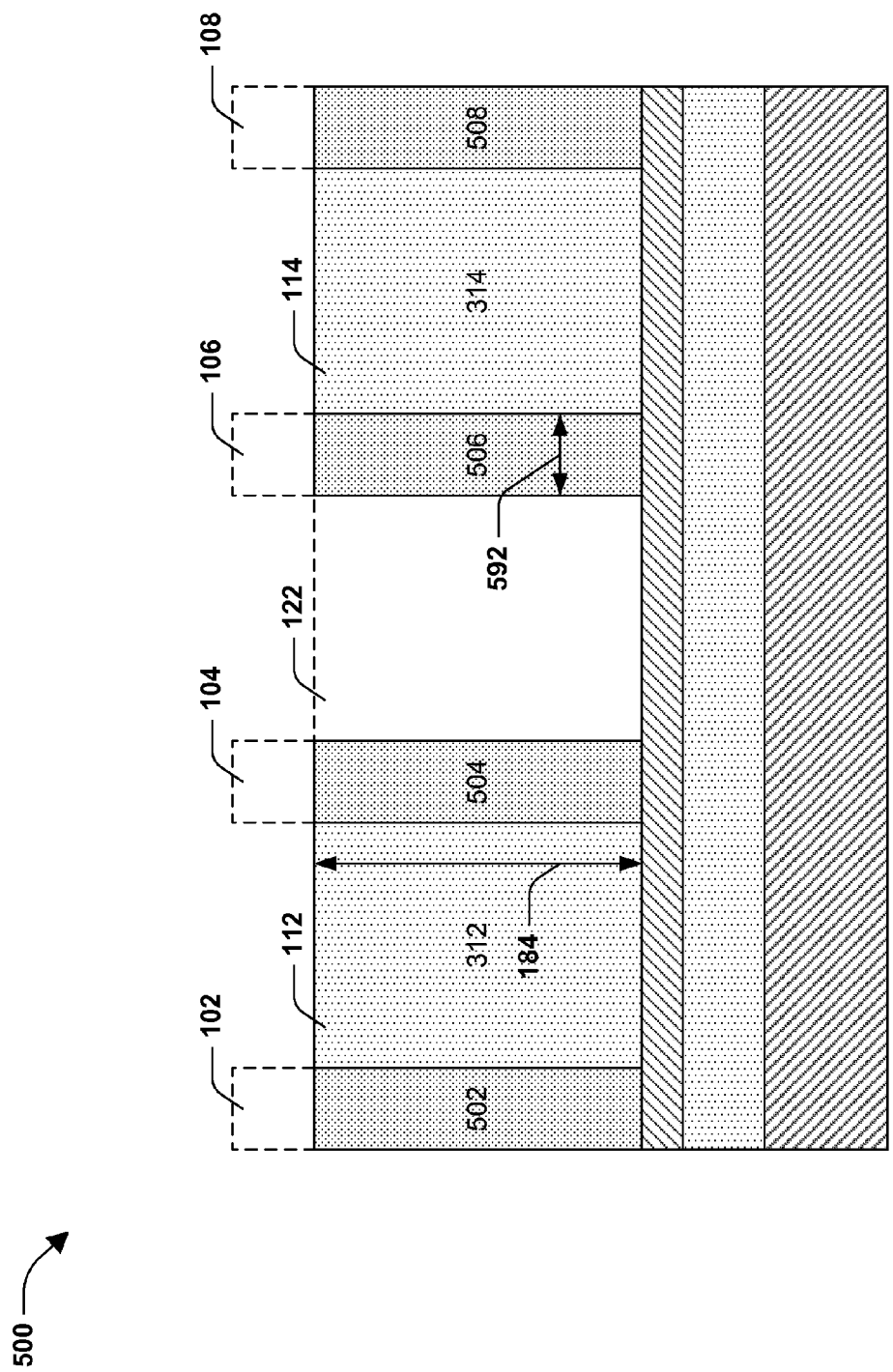
FIG. 5 is a cross-sectional view associated with formation of an example pattern during semiconductor fabrication, according to some embodiments.

FIG. 5 is a cross-sectional view 500 associated with formation of an example pattern during semiconductor fabrication, according to some embodiments. In some embodiments, at least some of the spacer region 410 is removed to form at least one of a first spacer 502, a second spacer 504, a third spacer 506, or a fourth spacer 508. In some embodiments, the first spacer 502 is formed within at least a portion of the first spacer location 102. Similarly, at least one of the second spacer 504, the third spacer 506, or the fourth spacer 508 are formed within at least a portion of at least one of the second spacer location 104, the third spacer location 106, or the fourth spacer location 108, respectively. In some embodiments, at least some of the spacer region 410 is removed based on an etch. For example, a thickness, such as the spacer region thickness 492, associated with the spacer region 410 is removed selectively, such as in a vertical direction. In other words, a top portion and a bottom portion of the spacer region 410 are removed, for example. In some embodiments, the spacer region 410 is removed in a vertical fashion. In some embodiments, at least some of the spacer region 410 is removed based on at least one of an orientation dependent etch, such as an isotropic etch, an anisotropic etch, or an reactive ion etch (RIE). According to some aspects, at least some of the spacer region 410 is removed based on at least one of a plasma etch or etch and 'ash'. In some embodiments, a portion of the spacer region 410 removed is associated with a thickness, such as the spacer region thickness 492 of FIG. 4. However, in some embodiments, spacer region 410 is generally not removed in a lateral fashion. For example, a width 592 associated with the spacer region 410 within the third spacer location 106 is generally about the same between FIG. 4 and FIG. 5. Accordingly, in some embodiments, at least some of the spacer region 410 above a height 184 of at least one of the first PR region 312 or the second PR region 314 is removed. In some embodiments, at least some of the spacer region 410 associated with the first sub-gap 122 is removed. Accordingly, at least one of the first spacer 502, the second spacer 504, the third spacer 506, or the fourth spacer 508 is formed, for example. It will be appreciated that at least one of the first spacer 502, the second spacer 504, the third spacer 506, or the fourth spacer 508 is formed within at least a portion of at least one of the first spacer location 102, the second spacer location 104, the third spacer location 106, or the fourth spacer location 108, at least because a portion of the spacer region 410 is removed. For example, the portion of the spacer region 410 is removed at least one of above the height 184 of the patterned PR region or based on a thickness of the spacer region 410, such as the spacer region thickness 492 of FIG. 4.

Figure 6:
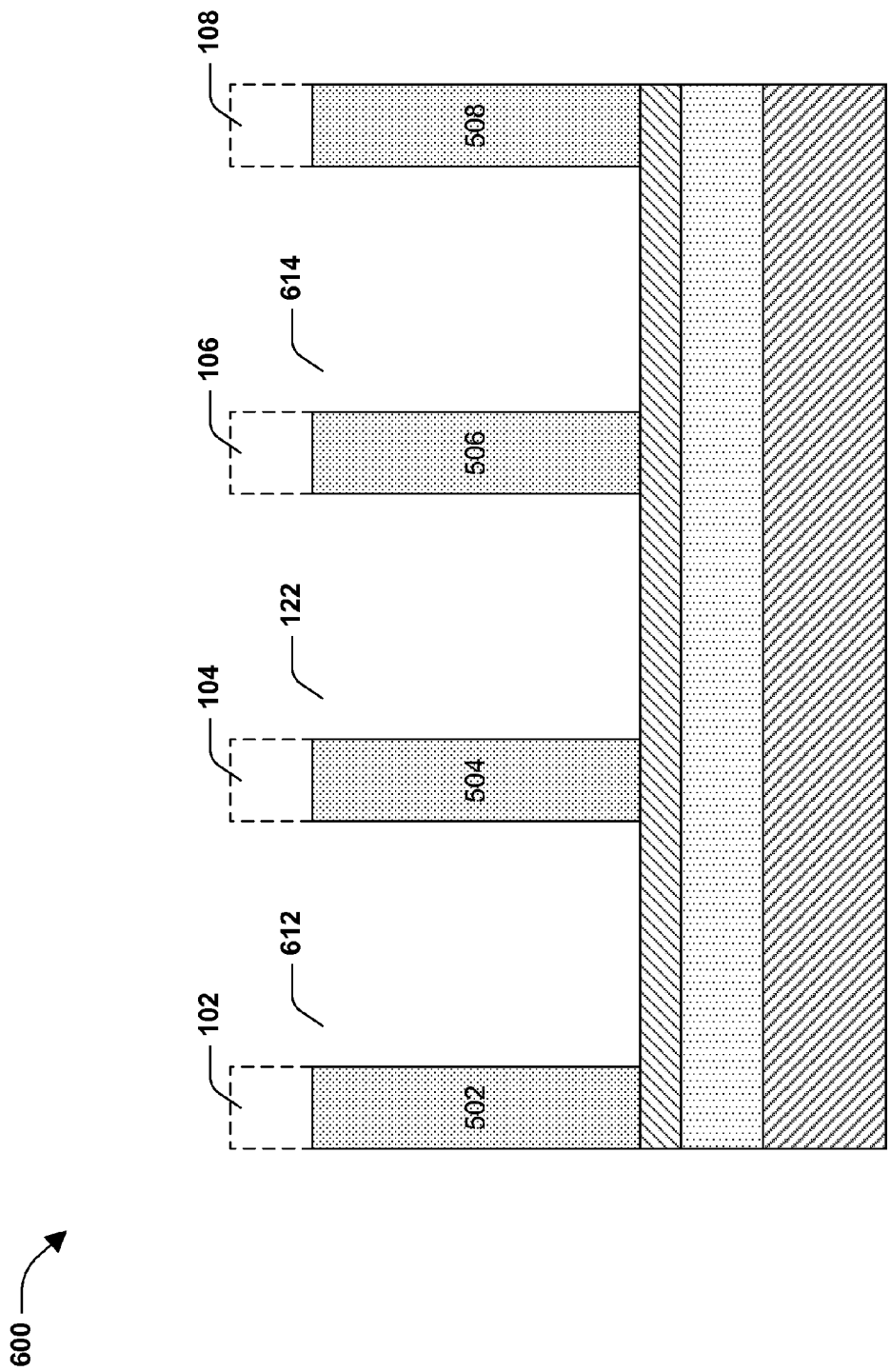
FIG. 6 is a cross-sectional view associated with formation of an example pattern during semiconductor fabrication, according to some embodiments.

FIG. 6 is a cross-sectional view 600 associated with formation of an example pattern during semiconductor fabrication, according to some embodiments. In some embodiments the patterned PR region is removed. For example, at least one of the first PR region 312 or the second PR region 314 is removed. In this way, one or more sub-gaps are formed. For example, a sub-gap 612 is formed by removing the first PR region 312. Additionally, a second sub-gap 614 is formed by removing the second PR region 314. It will be appreciated that the sub-gap 612 corresponds to the first PR location 112 of FIG. 1 and the second sub-gap 614 corresponds to the second PR location 114 of FIG. 1. In some embodiments, the sub-gap 612 is the first PR location 112 of FIG. 1 and the second sub-gap 614 is the second PR location 114 of FIG. 1. Accordingly, the structure of FIG. 6 is an example of a spacer pattern. For example, the spacer pattern of FIG. 6 comprises the spacer region and one or more sub-gaps. It will be appreciated that the spacer region of FIG. 6 comprises one or more spacers, such as the first spacer 502, the second spacer 504, the third spacer 506, or the fourth spacer 508. In some examples, the spacer pattern is associated with an alternating spacer, sub-gap, spacer, sub-gap, etc. architecture. For example, the spacer pattern of FIG. 6 comprises the first spacer 502, the sub-gap 612, the second spacer 504, the first sub-gap 122, the third spacer 506, the second sub-gap 614, and the fourth spacer 508. It will be appreciated, however, that FIG. 6 is merely an example, and that any number of spacers or sub-gaps are contemplated, for example.

Figure 7:
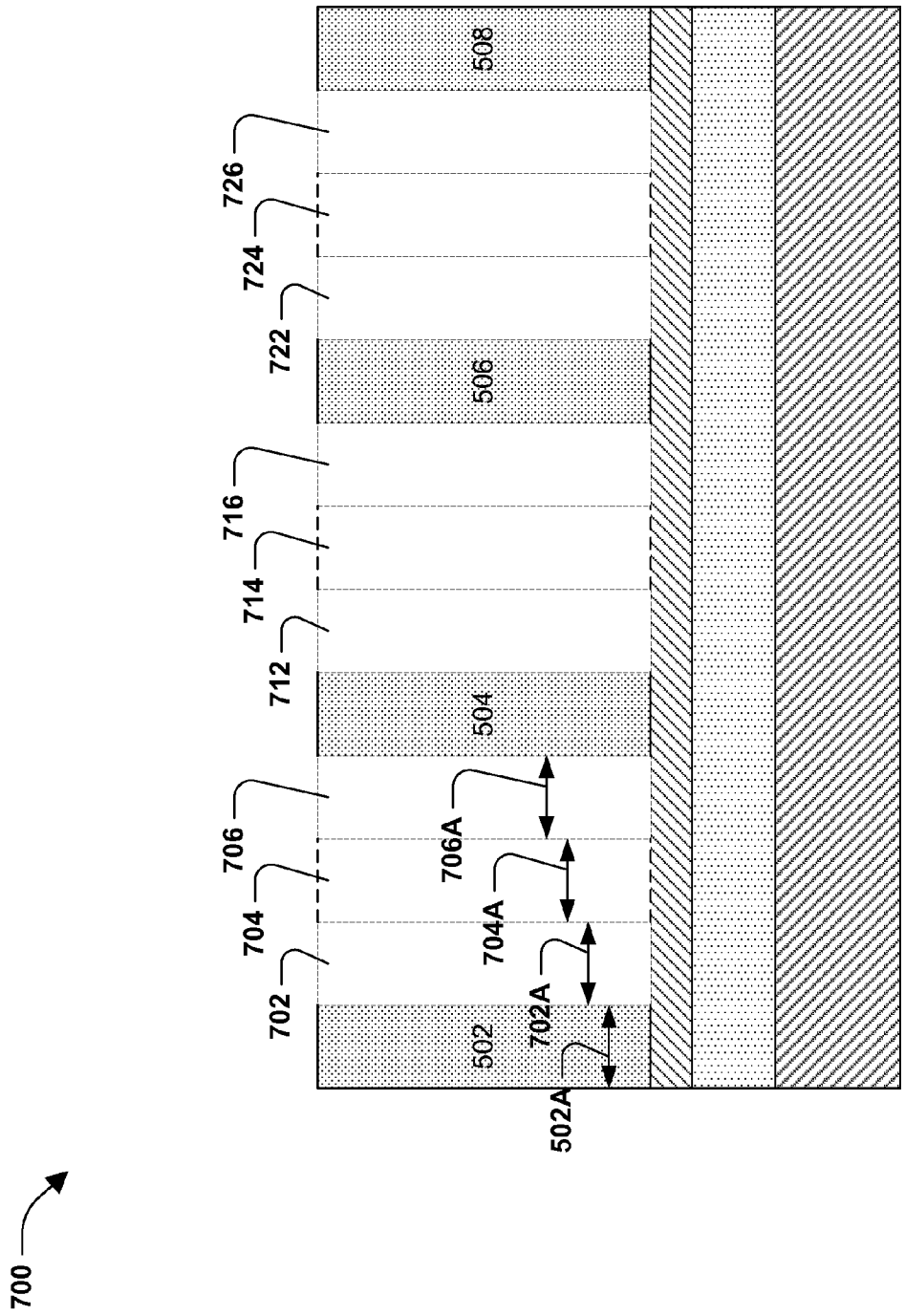
FIG. 7 is a cross-sectional view associated with formation of an example pattern during semiconductor fabrication, according to some embodiments.

FIG. 7 is a cross-sectional view 700 associated with formation of an example pattern during semiconductor fabrication, according to some embodiments. FIG. 7 is similar to FIG. 6, except that the respective sub-gaps, such as 612, 122, or 614, of FIG. 6 are described in further detail. For example, the sub-gap 612 of FIG. 6 is associated with at least one of a first 'second polymer' location 702, a first 'first polymer' location 704, or a second 'second polymer' location 706. In some embodiments, the sub-gap 612 comprises the first 'second polymer' location 702, the first 'first polymer' location 704, or the second 'second polymer' location 706. In some embodiments, the first 'second polymer' location 702 is between the first spacer 502 and the first 'first polymer' location 704. In some embodiments, the first 'first polymer' location 704 is between the first 'second polymer' location 702 and the second 'second polymer' location 706. In some embodiments, the second 'second polymer' location 706 is between the first 'first polymer' location 704 and the second spacer 504. In some embodiments, the first spacer 502 is associated with a width 502A. Additionally, at least one of the first 'second polymer' location 702, the first 'first polymer' location 704, or the second 'second polymer' location 706 are associated with widths 702A, 704A, or 706A, respectively. In some embodiments, widths 502A, 702A, 704A, and 706A are the same width.

Similarly, the first sub-gap 122 is associated with at least one of a third 'second polymer' location 712, a second 'first polymer' location 714, or a fourth 'second polymer' location 716. In some embodiments, the first sub-gap 122 comprises the third 'second polymer' location 712, the second 'first polymer' location 714, or the fourth 'second polymer' location 716. In some embodiments, the second spacer 504 is between the second 'second polymer' location 706 and the third 'second polymer' location 712. In some embodiments, the third 'second polymer' location 712 is between the second spacer 504 and the second 'first polymer' location 714. In some embodiments, the second 'first polymer' location 714 is between the third 'second polymer' location 712 and the fourth 'second polymer' location 716. In some embodiments, the fourth 'second polymer' location 716 is between the second 'first polymer' location 714 and the third spacer 506. In some embodiments, respective spacers 504, 506, and 508 are associated with widths equal to width 502A. Additionally, polymer locations 712, 714, 716, 722, 724, and 726 are associated with widths similar to widths 702A, 704A, or 706A, respectively. It will be appreciated that at least one of a fifth 'second polymer' location 722, a third 'first polymer' location 724, or a sixth 'second polymer' location 726 is configured according to a similar fashion as the first 'second polymer' location 702, the first 'first polymer' location 704, or the second 'second polymer' location 706, etc.

Figure 8:
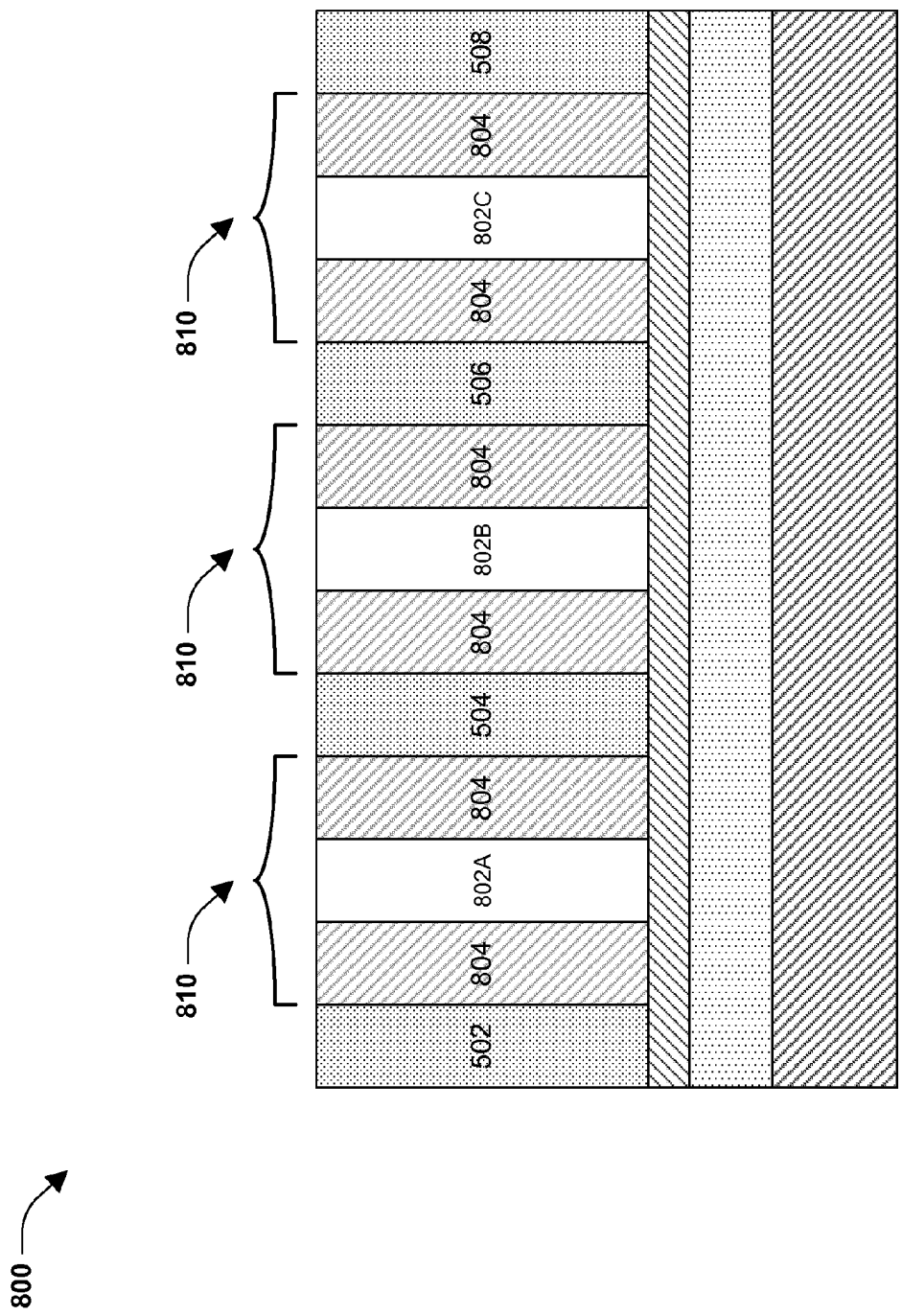
FIG. 8 is a cross-sectional view associated with formation of an example pattern during semiconductor fabrication, according to some embodiments.

FIG. 8 is a cross-sectional view 800 associated with formation of an example pattern during semiconductor fabrication, according to some embodiments. In some embodiments, at least one of the sub-gap 612, the first sub-gap 122, or the second sub-gap 614 of FIG. 6 is filled with a block co-polymer (BCP) 810. In some embodiments, at least one of the first 'second polymer' location 702, the first 'first polymer' location 704, the second 'second polymer' location 706, the third 'second polymer' location 712, the second 'first polymer' location 714, the fourth 'second polymer' location 716, the fifth 'second polymer' location 722, the third 'first polymer' location 724, or the sixth 'second polymer' location 726 of FIG. 7 is filled with the BCP 810. In some embodiments, the BCP 810 comprises a first polymer 802 and a second polymer 804. In some embodiments, the BCP 810 is self aligning, and separates during phase separation of the BCP 810. For example, the BCP 810 is self aligning such that the second polymer 804 of the BCP 810 is in contact with respective spacers, such as at least one of the first spacer 502, the second spacer 504, the third spacer 506, or the fourth spacer 508. Additionally, it will be appreciated that the first polymer 802 of the BCP 810 is not in contact with the respective spacers 502, 504, 506, or 508, for example.

In some embodiments, the BCP 810 self aligns such that a first polymer 802 of the BCP 810 is located within at least one of the first 'first polymer' location 704, the second 'first polymer' location 714, or the third 'first polymer' location 724, thus forming one or more 'first polymer' spacers, such as 802A, 802B, or 802C, at respective locations. It will be appreciated that the respective 'first polymer' spacers are not in contact with spacers of the spacer region, such as at least one of the first spacer 502, the second spacer 504, the third spacer 506, or the fourth spacer 508. Accordingly, it will be appreciated that the BCP 810 self aligns in an alternating fashion. For example, the BCP 810 is associated with a 'second polymer' spacer 804, a 'first polymer' spacer 802A, another 'second polymer' spacer 804, etc. In some embodiments, the BCP 810 self aligns such that a second polymer 804 of the BCP 810 is located within at least one of the first 'second polymer' location 702, the second 'second polymer' location 706, the third 'second polymer' location 712, the fourth 'second polymer' location 716, the fifth 'second polymer' location 722, or the sixth 'second polymer' location 726, thus forming one or more 'second polymer' spacers 804 at respective locations. It will be appreciated that the respective 'second polymer' spacers 804 are in contact with spacers of the spacer region, such as at least one of the first spacer 502, the second spacer 504, the third spacer 506, or the fourth spacer 508. Accordingly, the BCP 810 and the spacer region of FIG. 8 form a pattern comprising a spacer, a first 'second polymer' spacer, a first 'first polymer' spacer, and a second 'second polymer' spacer. In some embodiments, the pattern repeats any number of times, for example. In some embodiments, the pattern associated with FIG. 8 comprises a first spacer 502, a first 'second polymer' spacer 804, a first 'first polymer' spacer 802A, and a second 'second polymer' spacer 804. It will be appreciated that the first 'second polymer' spacer is associated with the first 'second polymer' location 702 of FIG. 7 and the second 'second polymer' spacer is associated with the second 'second polymer' location 706 of FIG. 7. Similarly, the first 'first polymer' spacer 802A is associated with the first 'first polymer' location 704 of FIG. 7. In some embodiments, the BCP 810 comprises polystyrene-polymethylmethacrylate (PS-PMMA). For example, the first polymer 802 is polystyrene (PS) and the second polymer is polymethylmethacrylate (PMMA). However, other block co-polymers are contemplated, and are used to control a width of respective polymer spacers, such as the 'first polymer' spacers 802 or the 'second polymer' spacers 804. For example, a BCP different than BCP 810 is associated with widths different than widths 702A, 704A, or 706A of FIG. 7. In this way, selection of a BCP enables a width of respective polymer spacers to be controlled, thus enabling a pattern density associated with the width of respective polymer spacers to be adjusted, for example. Additionally, since the width of respective polymer spacers is controlled, a corresponding pitch between elements of the pattern is adjustable based on the width, for example. Accordingly, the pattern density is controlled based on at least one of the pitch or the width of respective polymer spacers. For example, a width associated with the first 'first polymer' spacer 704, such as width 704A of FIG. 7 is associated with a width of elements of a corresponding pattern. Additionally, a width associated with the first 'second polymer' spacer 702, such as width 702A of FIG. 7 is associated with a pitch between elements of the corresponding pattern. It will be appreciated that in some embodiments, a BCP is selected based on a self aligning property of the BCP. For example, the PS-PMMA is selected at least because the PMMA aligns such that the PMMA is in contact with a spacer, for example. Accordingly, it will be appreciated the spacers of FIG. 7, such as at least one of the first spacer 502, the second spacer 504, the third spacer 506, or the fourth spacer 508, acts as a 'guide' for the BCP. For example, one or more spacers are used to 'define' regions associated with the BCP, such as at 702, 704, and 706, for example. In this way, pattern density limitations are mitigated, at least because the respective spacers facilitate formation of a pattern along with the BCP.

Figure 9:
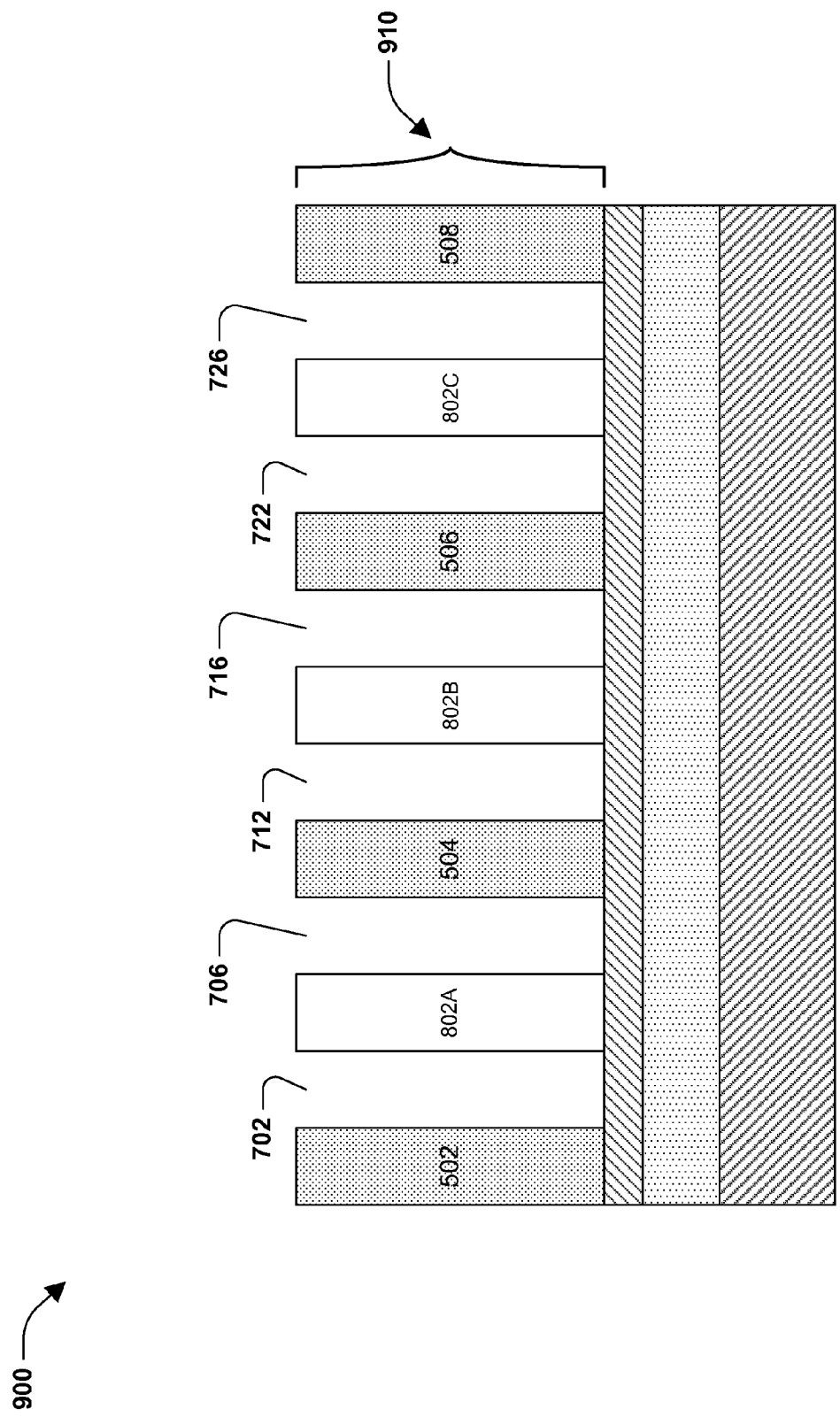
FIG. 9 is a cross-sectional view of an example pattern during semiconductor fabrication, according to some embodiments.

FIG. 9 is a cross-sectional view 900 of an example pattern 910 during semiconductor fabrication, according to some embodiments. In some embodiments, the pattern 910 of FIG. 9 comprises one or more spacers and one or more 'first polymer' spacers. For example, at least some of the spacers 502, 504, 506, or 508 and at least some of the 'first polymer' spacers 802 are separated by one or more 'second polymer' locations, such as locations 702, 706, 712, 716, 722, or 726. In some embodiments, the 'second polymer' spacers are removed such that respective 'second polymer' locations 702, 706, 712, 716, 722, or 726 form gaps between respective spacers and respective 'first polymer' spacers 802. For example, the 'second polymer' spacer 804 associated with the first 'second polymer' location 702 of FIG. 7 is removed such that the first 'second polymer' location 702 is empty, thus forming a gap between the first spacer 502 and the first 'first polymer' spacer 802A. Similarly, one or more 'second polymer' spacers 804 are removed to form gaps from 'second polymer' locations 706, 712, 716, 722, or 726. Accordingly, in some embodiments, at least some of the second polymer 804 is removed to form the pattern 910 of FIG. 9. In some embodiments the pattern 910 of FIG. 9 comprises one or more elements, such as the one or more spacers or the one or more 'first polymer' spacers 802. It will be appreciated that respective elements of the pattern 910 of FIG. 9 are separated by the gaps associated with 'second polymer' locations. In some embodiments, a width of respective elements, such as the first spacer 502 or the first 'first polymer' spacer 802A, is the same as a width of a gap associated with a 'second polymer' location, such as location 702. For example, the first space 502 is associated with width 502A of FIG. 7. In some embodiments, the first 'second polymer' location 702 is associated with width 702A of FIG. 7. In some embodiments, the first 'first polymer' spacer 802A is associated with width 704A of FIG. 7. Additionally, the second 'second polymer' location 706 is associated with width 706A of FIG. 7. It will be appreciated that in some embodiments, widths 502A, 702A, 704A, and 706A are substantially the same. In some embodiments, the pattern 910 of FIG. 9 is associated with a spacer, a gap corresponding to a 'second polymer' location, a 'first polymer' spacer, and another gap corresponding to another 'second polymer' location. In some embodiments, the pattern 910 repeats any number of times, for example. In FIG. 9, the pattern 910 comprises a first spacer 502, a first 'second polymer' location 702, a first 'first polymer' spacer 802A, a second 'second polymer' location 706, a second spacer 504, a third 'second polymer' location 712, a second 'first polymer' spacer 802B, a fourth 'second polymer' location 716, a third spacer 506, a fifth 'second polymer' location 722, a third 'first polymer' spacer 802C, a sixth 'second polymer' location 726, and a fourth spacer 508. In some embodiments, the first 'second polymer' location 702 is between the first spacer 502 and the first 'first polymer' spacer 802A. In some embodiments, the first 'first polymer' spacer 802A is between the first 'second polymer' location 702 and the second 'second polymer' location 706. In some embodiments, the second 'second polymer' location 706 is between the first 'first polymer' spacer 802A and the second spacer 504. In some embodiments, the second spacer 504 is between the second 'second polymer' location 706 and the third 'second polymer' location 712. It will be appreciated that remaining spacers 506 and 508, 'first polymer' spacers 802B and 802C, or 'second polymer' locations 716, 722, and 726 are positioned accordingly in a similar fashion.

In some embodiments, 702A and 706A of FIG. 7 are associated with a pitch of a corresponding pattern, at least because the pitch is a distance from one element of a pattern to another element. For example, a first element, such as the first spacer 502 is separated by a distance 702A from a second element, such as the first 'first polymer' spacer 802A. Similarly, the second element, such as the first 'first polymer' spacer 802A is separated from the third element, such as the second spacer 504 by distance 706A.

Figure 10:
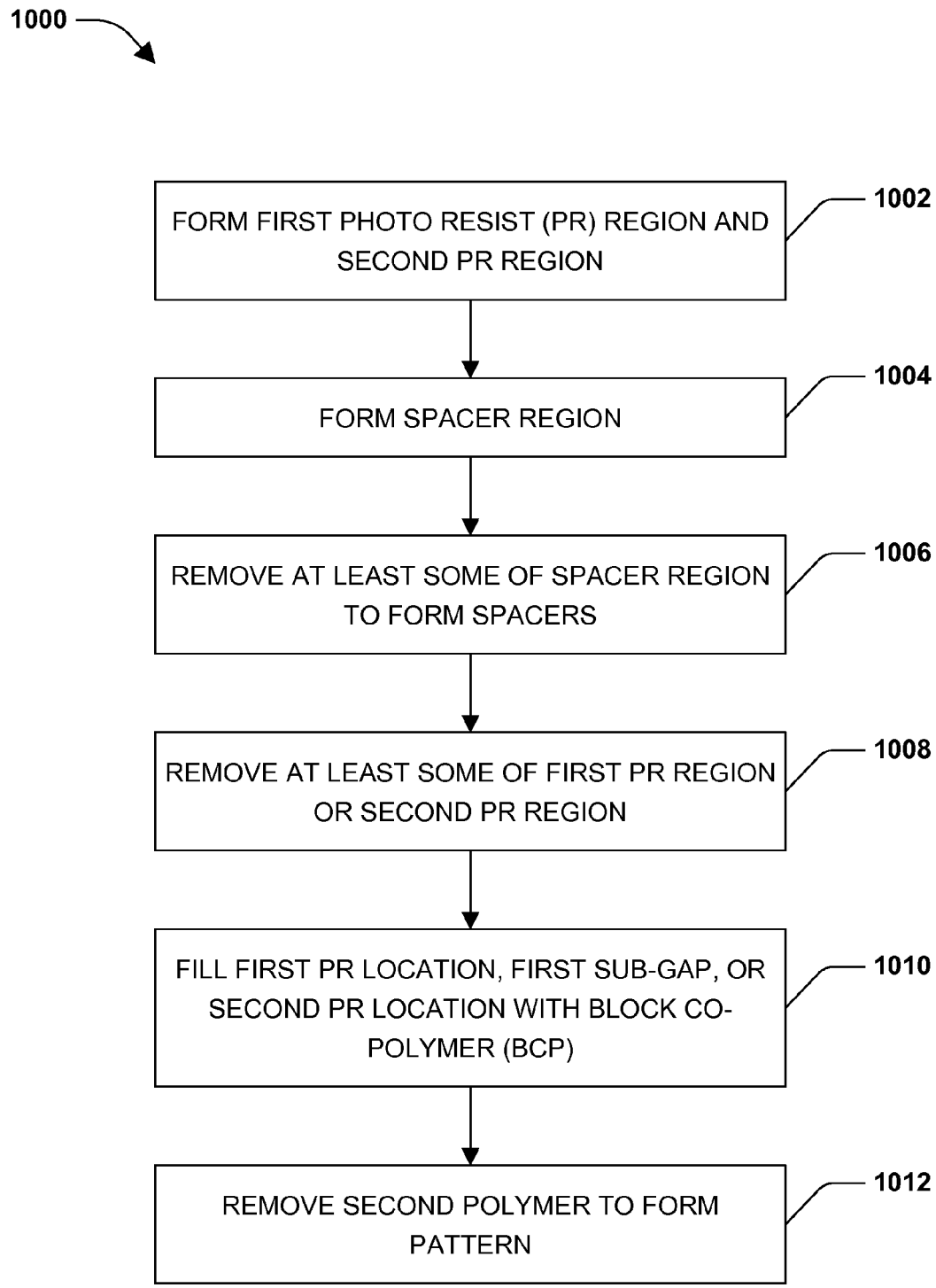
FIG. 10 is a flow diagram of an example method for forming a pattern during semiconductor fabrication, according to some embodiments.

FIG. 10 is a flow diagram of an example method 1000 for forming a pattern during semiconductor fabrication, according to some embodiments. In some embodiments, the method 1000 comprises forming a first photo resist (PR) region at a first PR location at 1002. In some embodiments, the method 1000 comprises forming a PR region comprising the first PR region and the second PR region. Additionally at 1002, the method 1000 comprises forming a second PR region at a second PR location. Additionally, a first gap is between the first PR region and the second PR region. In some embodiments, the first gap is associated with a second spacer location, a first sub-gap, and a third spacer location, the first PR location is between a first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and a fourth spacer location. In some embodiments, the method 1000 comprises patterning the PR region. For example, patterning the PR region comprises removing PR associated with at least one of the first spacer location, the second spacer location, the first sub-gap, the third spacer location, or the fourth spacer location. At 1004, the method 1000 comprises forming a spacer region. In some embodiments, the spacer region comprises at least one of spacer oxide or spacer nitride. Additionally, the spacer region is formed above at least some of at least one of the first PR region or the second PR region. For example, the spacer region is formed within at least some of at least one of the first spacer location, second spacer location, third spacer location, or fourth spacer location. For example, the spacer region is formed within at least some of the first sub-gap. In some embodiments, the spacer region is formed to comprise a spacer region thickness. At 1006, the method 1000 comprises removing at least some of the spacer region to form at least one of a first spacer in the first spacer location, a second spacer in the second spacer location, a third spacer in the third spacer location, or a fourth spacer in the fourth spacer location. At 1008, the method 1000 comprises removing at least some of at least one of the first PR region or the second PR region. At 1010, the method 1000 comprises filling at least some of at least one of the first PR location, the first sub-gap, or the second PR location with a block co-polymer (BCP). For example, the BCP comprises a first polymer and a second polymer. It will be appreciated that the BCP is selected based on a self aligning property of the BCP. In some embodiments, the BCP is annealed. At 1012, the method 1000 comprises removing at least some of the second polymer to form a pattern comprising the first polymer and the spacer region. For example, the method 1000 comprises removing at least some of the second polymer by etching the second polymer based on at least one of a dry etch, a plasma etch, or reactive ion etching (RIE), for example. In some embodiments, the first polymer of the pattern comprises one or more 'first polymer' spacers. In some embodiments, the pattern is used to pattern a hard mask (HM) region.

Figure 11:
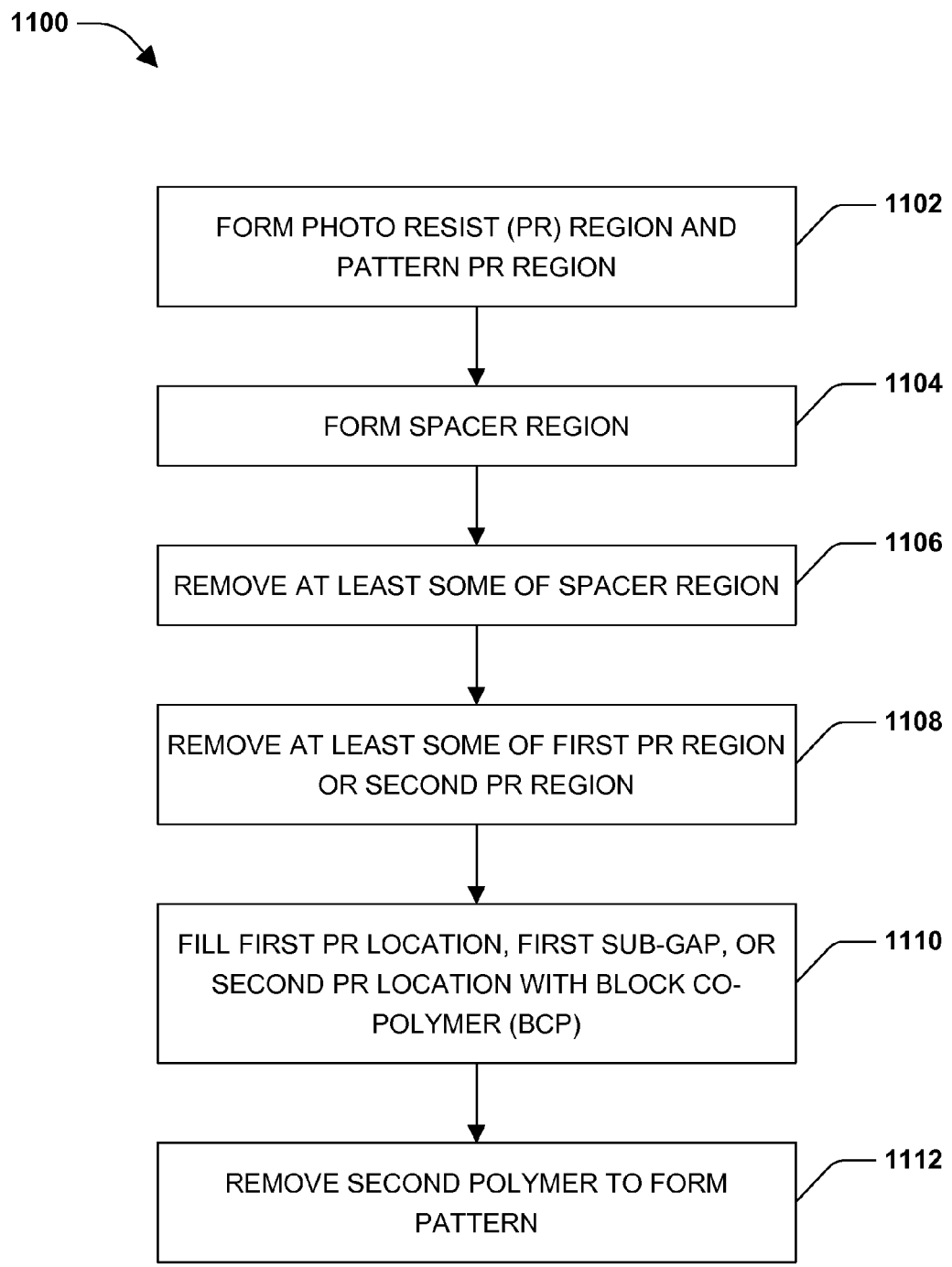
FIG. 11 is a flow diagram of an example method for forming a pattern during semiconductor fabrication, according to some embodiments.

FIG. 11 is a flow diagram of an example method 1100 for forming a pattern during semiconductor fabrication, according to some embodiments. In some embodiments, the method 1100 comprises forming a photo resist (PR) region associated with at least one of a first spacer location, a first PR location, a second spacer location, a first sub-gap, a third spacer location, a second PR location, or a fourth spacer location at 1102. For example, the first PR location is between the first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and the fourth spacer location. Additionally, the method 1100 comprises, at 1102, patterning the PR region to form at least one of a first PR region at the first PR location or a second PR region at the second PR location. At 1104, the method 1100 comprises forming a spacer region. For example, the spacer region is formed at least one of above at least some of at least one of the first PR region or the second PR region, within at least some of at least one of the first spacer location, second spacer location, third spacer location, or fourth spacer location, or within at least some of the first sub-gap. At 1106, the method 1100 comprises removing at least some of the spacer region at least one of above a height of at least one of the first PR region or the second PR region or associated with the first sub-gap. At 1108, the method 1100 comprises removing at least some of at least one of the first PR region or the second PR region. At 1110, the method 1100 comprises filling at least some of at least one of the first PR location, the first sub-gap, or the second PR location with a block co-polymer (BCP). For example, the BCP comprises a first polymer and a second polymer. In some embodiments, the method 1100 comprises, filling at least some of at least one of the first PR region, the first sub-gap, or the second PR region with the BCP, the BCP comprising polystyrene-polymethylmethacrylate (PS-PMMA), the first polymer comprising polystyrene (PS), the second polymer comprising polymethylmethacrylate (PMMA). In some embodiments, the BCP is self aligning. Additionally, the BCP is annealed. In some embodiments, the method 1100 comprises removing at least some of the second polymer by removing at least some of the PMMA. For example, the pattern is formed based on etching at least some of the second polymer. In some embodiments, the method 110 comprises removing at least some of the second polymer to form a pattern comprising the first polymer and the spacer region at 1112. In some embodiments, the method 1100 comprises removing at least some of the second polymer by forming at least one of a first 'first polymer' spacer at a first 'first polymer' location, a second 'first polymer' spacer at a second 'first polymer' location, or a third 'first polymer' spacer at a third 'first polymer' location. In some embodiments, the pattern is used as a mask to pattern a hard mask (HM) region or associated dielectric etching, for example.

Figure 12:
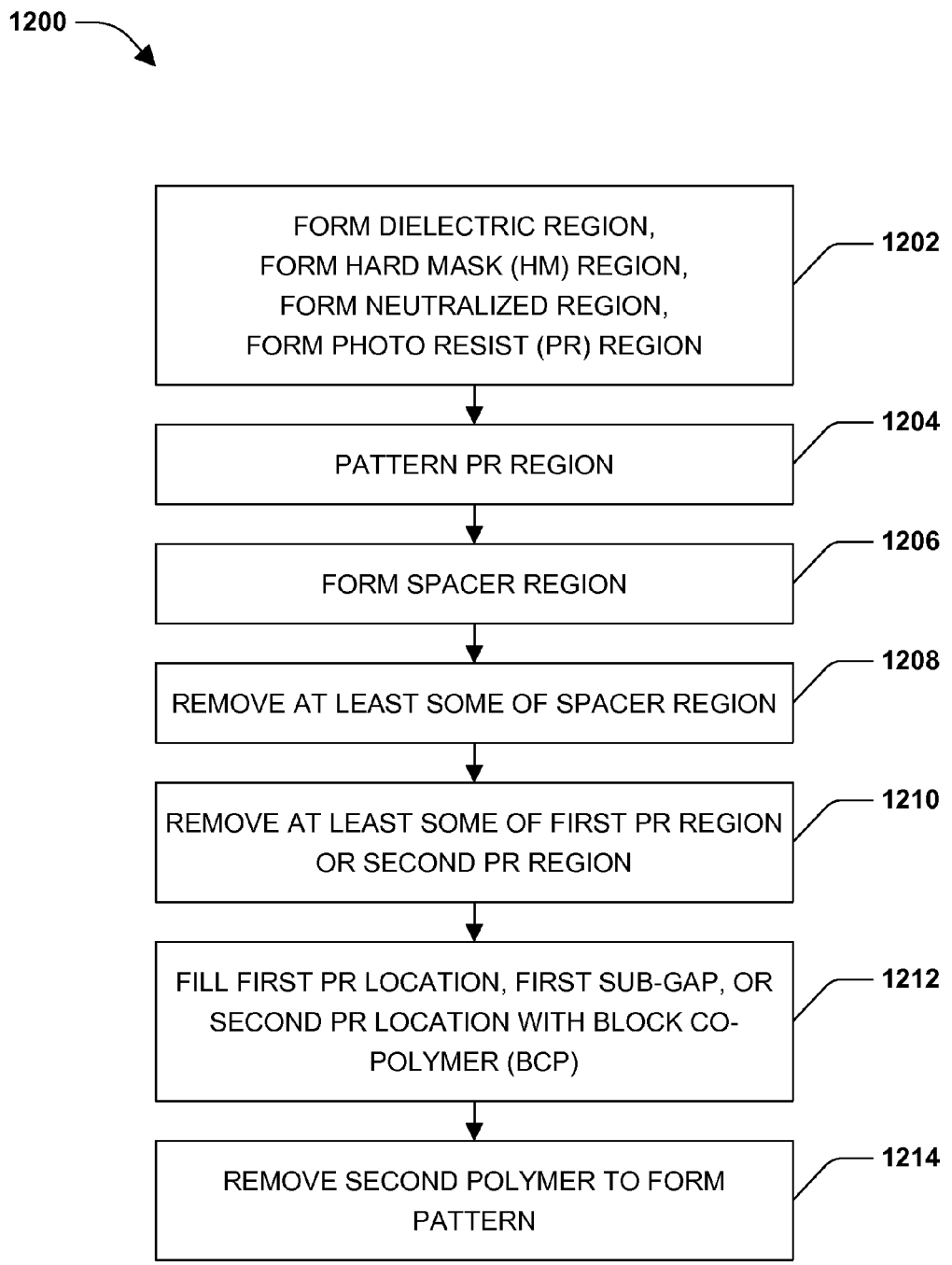
FIG. 12 is a flow diagram of an example method for forming a pattern during semiconductor fabrication, according to some embodiments.

FIG. 12 is a flow diagram of an example method 1200 for forming a pattern during semiconductor fabrication, according to some embodiments. For example, in some embodiments, the method 1200 comprises forming a dielectric region, forming a hard mask (HM) region above at least some of the dielectric region, forming a neutralized region above at least some of the HM region, and forming a photo resist (PR) region above at least some of the neutralized region at 1202.

In some embodiments, the PR region is associated with at least one of a first spacer location, a first PR location, a second spacer location, a first sub-gap, a third spacer location, a second PR location, or a fourth spacer location. Additionally, the first PR location is between the first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and the fourth spacer location. At 1204, the method 1200 comprises patterning the PR region to form at least one of a first PR region at the first PR location or a second PR region at the second PR location. In some embodiments, the method 1200 comprises forming a spacer region at least one of above at least some of at least one of the first PR region or the second PR region, within at least some of at least one of the first spacer location, second spacer location, third spacer location, or fourth spacer location, or within at least some of the first sub-gap at 1206. In some embodiments, the method 1200 comprises removing at least some of the spacer region to form at least one of a first spacer in the first spacer location, a second spacer in the second spacer location, a third spacer in the third spacer location, or a fourth spacer in the fourth spacer location at 1208. At 1210, the method 1200 comprises removing at least some of at least one of the first PR region or the second PR region. At 1212, the method 1200 comprises filling at least some of at least one of the first PR location, the first sub-gap, or the second PR location with a block co-polymer (BCP), where the BCP comprising a first polymer and a second polymer. At 1214, the method 1200 comprises removing at least some of the second polymer to form a pattern comprising the first polymer and the spacer region.

According to some aspects, a method for forming a pattern during semiconductor fabrication is provided, comprising forming a first photo resist (PR) region at a first PR location. In some embodiments, the method comprises forming a second PR region at a second PR location. Additionally, a first gap is between the first PR region and the second PR region. For example, the first gap is associated with a second spacer location, a first sub-gap, and a third spacer location, the first PR location is between a first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and a fourth spacer location. In some embodiments, the method comprises forming a spacer region. For example, the spacer region is formed above at least some of at least one of the first PR region or the second PR region. For example, the spacer region is formed within at least some of at least one of the first spacer location, second spacer location, third spacer location, or fourth spacer location. For example, the spacer region is formed within at least some of the first sub-gap. In some embodiments, the method comprises removing at least some of the spacer region to form at least one of a first spacer in the first spacer location, a second spacer in the second spacer location, a third spacer in the third spacer location, or a fourth spacer in the fourth spacer location. Additionally, the method comprises removing at least some of at least one of the first PR region or the second PR region. In some embodiments, the method comprises filling at least some of at least one of the first PR location, the first sub-gap, or the second PR location with a block co-polymer (BCP). For example, the BCP comprises a first polymer and a second polymer. In some embodiments, the method comprises removing at least some of the second polymer to form a pattern comprising the first polymer and the spacer region.

According to some aspects, a method for forming a pattern during semiconductor fabrication is provided, comprising forming a photo resist (PR) region associated with at least one of a first spacer location, a first PR location, a second spacer location, a first sub-gap, a third spacer location, a second PR location, or a fourth spacer location. In some embodiments, the first PR location is between the first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and the fourth spacer location. In some embodiments, the method comprises patterning the PR region to form at least one of a first PR region at the first PR location or a second PR region at the second PR location. In some embodiments, the method comprises forming a spacer region at least one of above at least some of at least one of the first PR region or the second PR region, within at least some of at least one of the first spacer location, second spacer location, third spacer location, or fourth spacer location, or within at least some of the first sub-gap. In some embodiments, the method comprises removing at least some of the spacer region. For example, the method comprises removing at least some of the spacer region above a height of at least one of the first PR region or the second PR region. For another example, the method comprises removing at least some of the spacer region associated with the first sub-gap. Additionally, the method comprises removing at least some of at least one of the first PR region or the second PR region. In some embodiments, the method comprises filling at least some of at least one of the first PR location, the first sub-gap, or the second PR location with a block co-polymer (BCP). In some embodiments, the BCP comprises a first polymer and a second polymer. In some embodiments, the method comprises removing at least some of the second polymer to form a pattern comprising the first polymer and the spacer region.

According to some aspects, a method for forming a pattern during semiconductor fabrication is provided, comprising forming a dielectric region, forming a hard mask (HM) region above at least some of the dielectric region, forming a neutralized region above at least some of the HM region, and forming a photo resist (PR) region above at least some of the neutralized region. In some embodiments, the PR region is associated with at least one of a first spacer location, a first PR location, a second spacer location, a first sub-gap, a third spacer location, a second PR location, or a fourth spacer location. In some embodiments, the first PR location is between the first spacer location and the second spacer location, the second spacer location is between the first PR location and the first sub-gap, the first sub-gap is between the second spacer location and the third spacer location, the third spacer location is between the first sub-gap and the second PR location, and the second PR location is between the third spacer location and the fourth spacer location. In some embodiments, the method comprises patterning the PR region to form at least one of a first PR region at the first PR location or a second PR region at the second PR location. In some embodiments, the method comprises forming a spacer region. For example, the spacer region is formed above at least some of at least one of the first PR region or the second PR region. Additionally, in some embodiments, the spacer region is formed within at least some of at least one of the first spacer location, second spacer location, third spacer location, or fourth spacer location. Additionally, in some embodiments, the spacer region is formed within at least some of the first sub-gap. In some embodiments, the method comprises removing at least some of the spacer region to form at least one of a first spacer in the first spacer location, a second spacer in the second spacer location, a third spacer in the third spacer location, or a fourth spacer in the fourth spacer location. In some embodiments, the method comprises removing at least some of at least one of the first PR region or the second PR region. In some embodiments, the method comprises filling at least some of at least one of the first PR location, the first sub-gap, or the second PR location with a block co-polymer (BCP), where the BCP comprises a first polymer and a second polymer. In some embodiments, the method comprises removing at least some of the second polymer to form a pattern comprising the first polymer and the spacer region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the photo resist (PR) region, first PR region, second PR region, first gap, spacer region, block co-polymer (BCP), etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, such as plasma etching, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A semiconductor pattern, comprising:
a first polymer between a first spacer and a second spacer, wherein a first gap is defined by the first polymer and the first spacer, the first gap measuring a first distance that is substantially equal to a width of the first polymer, the first polymer comprising a different composition than the first spacer and the second spacer, the first polymer having a first height and the first spacer having a second height equal to the first height.

2. The semiconductor pattern of claim 1, the first spacer comprising at least one of a spacer oxide, a spacer nitride, or a metal spacer.

3. The semiconductor pattern of claim 1, the first polymer comprising polystyrene.

4. The semiconductor pattern of claim 1, the width of the first polymer substantially equal to a width of the first spacer and to a width of the second spacer.

5. The semiconductor pattern of claim 1, wherein a second gap is defined by the first polymer and the second spacer.

6. The semiconductor pattern of claim 5, the second gap measuring a second distance.

7. The semiconductor pattern of claim 6, the second distance substantially equal to the first distance.

8. The semiconductor pattern of claim 1, the width of the first polymer substantially equal to at least one of:
a width of the first spacer, or
a width of the second spacer.

9. The semiconductor pattern of claim 1, comprising:
a neutralized region, wherein the first polymer, the first spacer, and the second spacer are above the neutralized region.

10. The semiconductor pattern of claim 9, comprising:
a hard mask region, wherein the neutralized region is above the hard mask region.

11. The semiconductor pattern of claim 10, comprising:
a dielectric region, wherein the hard mask region is above the dielectric region.

12. A semiconductor pattern, comprising:
a first spacer;
a second spacer; and
a first polymer having a first width and situated between the first spacer and the second spacer, wherein a first gap is defined by the first polymer and the first spacer, the first width about ¼ a pitch between a location on the first spacer and a corresponding location on the second spacer, the first gap measuring a first distance that is substantially equal to at least one of the first width or the second width, the first polymer comprising a different composition than the first spacer and the second spacer.

13. The semiconductor pattern of claim 12, the first spacer comprising spacer oxide.

14. The semiconductor pattern of claim 12, the first polymer comprising polystyrene (PS).

15. A semiconductor pattern, comprising:
a first spacer comprising spacer oxide;
a second spacer comprising spacer oxide; and
a first polymer between the first spacer and the second spacer, the first polymer comprising polystyrene (PS), wherein a first gap is defined by the first polymer and the first spacer, the first polymer having a first height and the first spacer having a second height equal to the first height.

16. The semiconductor pattern of claim 15, wherein a second gap, measuring a second distance, is defined by the first polymer and the second spacer.

17. The semiconductor pattern of claim 16, the first gap measuring a first distance that is substantially equal to the second distance.

18. The semiconductor pattern of claim 15, comprising:
a dielectric region;
a hard mask region above the dielectric region; and
a neutralized region above the hard mask region, wherein the first polymer, the first spacer, and the second spacer are above the neutralized region.

19. The semiconductor pattern of claim 15, the first gap measuring a first distance that is substantially equal to a width of the first spacer.

20. The semiconductor pattern of claim 15, a width of the first polymer less than or equal to about 16 nanometers.

* * * * *